United States Patent
Kajigaya

(10) Patent No.: US 8,248,875 B2
(45) Date of Patent: Aug. 21, 2012

(54) SEMICONDUCTOR MEMORY DEVICE HAVING FLOATING BODY TYPE NMOS TRANSISTOR

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 174 days.

(21) Appl. No.: 12/461,860

(22) Filed: Aug. 26, 2009

(65) Prior Publication Data

US 2010/0054016 A1   Mar. 4, 2010

(30) Foreign Application Priority Data

Aug. 28, 2008   (JP) ................................. 2008-220560

(51) Int. Cl.
*G11C 7/00* (2006.01)

(52) U.S. Cl. ........................................ 365/202; 365/207

(58) Field of Classification Search .................. 365/202, 365/207
See application file for complete search history.

(56) References Cited

U.S. PATENT DOCUMENTS

| | | | |
|---|---|---|---|
| 5,825,696 A | 10/1998 | Hidaka et al. | |
| 5,877,978 A | 3/1999 | Morishita et al. | |
| 6,037,808 A * | 3/2000 | Houston et al. ................. | 327/55 |
| 6,081,443 A | 6/2000 | Morishita et al. | |
| 6,091,647 A | 7/2000 | Hidaka et al. | |
| 6,288,949 B1 | 9/2001 | Hidaka et al. | |
| 6,599,797 B1 | 7/2003 | Hofmann et al. | |
| 6,635,915 B2 | 10/2003 | Kokubun | |
| 6,858,491 B1 | 2/2005 | Kokubun | |
| 2001/0014047 A1 | 8/2001 | Hidaka et al. | |
| 2002/0101754 A1 | 8/2002 | Hidaka et al. | |
| 2002/0195637 A1 | 12/2002 | Kokubun | |
| 2003/0206472 A1 | 11/2003 | Hidaka et al. | |
| 2005/0001254 A1 | 1/2005 | Hidaka et al. | |
| 2006/0118849 A1 | 6/2006 | Hidaka et al. | |
| 2007/0052028 A1 | 3/2007 | Hidaka et al. | |
| 2007/0257313 A1 | 11/2007 | Hidaka et al. | |
| 2008/0165601 A1* | 7/2008 | Matick et al. ................. | 365/202 |

(Continued)

FOREIGN PATENT DOCUMENTS

JP   6-21400   1/1994

(Continued)

OTHER PUBLICATIONS

J. Barth, et al., "A 500MHz Random Cycle 1.5ns-Latency, SOI Embedded DRAM Macro Featuring a 3T Micro Sense Amplifier", ISSCC Digest of Technical papers, pp. 3-5, Feb. 2007.

*Primary Examiner* — Jason Lappas

(74) *Attorney, Agent, or Firm* — McGinn IP Law Group, PLLC

(57) ABSTRACT

A semiconductor memory device comprises a memory cell array and a sense amplifier circuit. The memory cell array includes a first NMOS transistor which has a gate electrode connected to a word line and has one source/drain region connected to a bit line. The sense amplifier circuit includes a second NMOS transistor which has a gate electrode connected to the bit line and has one source/drain region connected to a predetermined voltage. In the semiconductor memory device, each of the first and second MOS transistors is a floating body type NMOS transistor, and the predetermined voltage is supplied to the bit line at least in a precharge operation, thereby preventing characteristic deterioration due to accumulation of holes in the floating body.

20 Claims, 11 Drawing Sheets

U.S. PATENT DOCUMENTS

2009/0310432 A1   12/2009   Yang et al.

FOREIGN PATENT DOCUMENTS

| | | |
|---|---|---|
| JP | 9-246483 | 9/1997 |
| JP | 11-284137 | 10/1999 |
| JP | 11-284146 | 10/1999 |
| JP | 2003-7856 | 1/2003 |
| JP | 2003-503856 | 1/2003 |
| JP | 2006-173640 | 6/2006 |
| JP | 2006-324683 | 11/2006 |

\* cited by examiner

NMOS TRANSISTOR HAVING SUROUND GATE STRUCTURE

SEMICONDUCTOR MEMORY DEVICE HAVING FLOATING BODY TYPE NMOS TRANSISTOR

BACKGROUND OF THE INVENTION

1. Field of the Invention

The present invention relates to a semiconductor memory device having a plurality of memory cells storing data and a sense amplifier circuit amplifying data read out from each memory cell, and particularly relates to a semiconductor memory device in which the memory cells and the sense amplifier circuit are configured using floating body type NMOS transistors.

2. Description of Related Art

A structure using an SOI (Silicon on Insulator) substrate has been known in order to achieve high speed operation and low consumption current in a semiconductor memory device such as a DRAM (Dynamic Random Memory). Generally, a MOS transistor using the SOI substrate operates as a so-called floating body type MOS transistor in which a body formed in a region between a source and a drain on an insulating film is in a floating state. For example, considering an operation of an N-type MOS transistor (NMOS transistor) in which a floating body is formed, a phenomenon occurs in which a large number of electron-hole pairs are generated due to impact ionization and holes as minority carriers are accumulated in the body over time. Such a phenomenon causes various characteristic deteriorations in the MOS transistors. For example, parasitic bipolar effect occurs, a threshold voltage decreases, or a kink appears in voltage current characteristics. As measures against these characteristic deteriorations in the case of employing the SOI substrate, various methods have been proposed in, for example, Patent References 1 to 8 and a Non-Patent Reference 1.

Patent Reference 1: Japanese Patent Application Laid-open No. 2006-324683
Patent Reference 2: Japanese Patent Application Laid-open No. 2006-173640
Patent Reference 3: Japanese Patent Application Laid-open No. 2003-7856
Patent Reference 4: Japanese Published Japanese Translation No. 2003-503856
Patent Reference 5: Japanese Patent Application Laid-open No. H11-284146
Patent Reference 6: Japanese Patent Application Laid-open No. H11-284137
Patent Reference 7: Japanese Patent Application Laid-open No. H9-246483
Patent Reference 8: Japanese Patent Application Laid-open No. H6-21400
Non-Patent Reference 1: J. Barth, et al., "A 500 MHz Random Cycle 1.5 ns-Latency, SOI Embedded DRAM Macro Featuring a 3T Micro Sense Amplifier", ISSCC Digest of Technical Papers, pp. 486-487, February 2007

The above-mentioned conventionally proposed methods include a technique to couple a fixed voltage to the body of a MOS transistor using the SOI substrate (Patent References 1 and 2), and a technique to form a conductive layer for supplying a fixed voltage (Patent References 3 and 4). Further, the above methods include a technique to separate a MOS transistor using the SOI substrate by forming a field shield layer thereon and to fix the potential of the body by locally controlling an electric field (Patent References 5 and 6). Further, the methods include a technique to allow holes accumulated in the body to escape by a control called "body refresh" (Patent Reference 7). Further, the above methods include a technique to form a memory cell using a P-type MOS transistor and to use electrons as majority carriers which are prone to be extracted from the body (Patent Reference 8). Further, the methods include a technique to precharge a bit line to a predetermined power supply voltage for a memory cell including a MOS transistor using the SOI substrate (Non-Patent Reference 1).

However, when employing the above conventional methods, there is a problem that an increase in chip area or in cost is inevitable. For example, a region for forming a complex structure and lines is required on and around the MOS transistor on the SOI substrate, or it is required to add a special process step in manufacturing process.

SUMMARY

The present invention seeks to solve one or more of the above problems and provides a semiconductor memory device in which memory cells and a sense amplifier circuit are configured using the floating body type NMOS transistors, a stable potential is supplied to a body so that characteristic deterioration due to accumulation of holes is reliably prevented, and a region for forming a complex structure and addition of a special process step are not required, thereby improving performance without an increase in chip area and without an increase in manufacturing cost.

An aspect of the present invention is a semiconductor memory device comprising: a memory cell including a first NMOS transistor having a gate electrode connected to a word line and having one source/drain region connected to a bit line; and a sense amplifier circuit including a second NMOS transistor having a gate electrode connected to the bit line and having one source/drain region connected to a predetermined voltage, wherein each of the first and second NMOS transistors is a floating body type NMOS transistor, and the predetermined voltage is supplied to the bit line at least in a precharge operation.

According to the semiconductor memory device of the aspect, the first NMOS transistor of the memory cell and the second NMOS transistor of the sense amplifier circuit are both the floating body type NMOS transistors, and the predetermined voltage is supplied to the bit line in the precharge operation. Thereby, one of source/drain regions of each of the NMOS transistors can be stabilized to the predetermined voltage. Thus, in the floating body type NMOS transistor, a phenomenon of accumulation of holes as minority carriers in the body does not occur, thereby preventing characteristic deteriorations. In this case, it is not required for the NMOS transistors that a complex structure and lines are provided and that a special process step is added to the manufacturing process. Therefore, by employing the floating body type NMOS transistor suitable for miniaturization, a semiconductor memory device having excellent characteristics with small chip area can be realized.

As described above, according to the invention, a configuration is achieved in which the floating body type NMOS transistors are employed in the memory cell and the sense amplifier circuit, and the predetermined voltage is supplied to one of source/drain regions of each NMOS transistor. Therefore, characteristic deteriorations due to accumulation of holes in the body can be suppressed, and it is possible to achieve a semiconductor memory device capable of reducing manufacturing cost with small chip area.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, an embodiment will be described with reference to the drawings, in which the present invention is applied to a DRAM (Dynamic Random Access Memory) as a semiconductor memory device.

Figure 1:
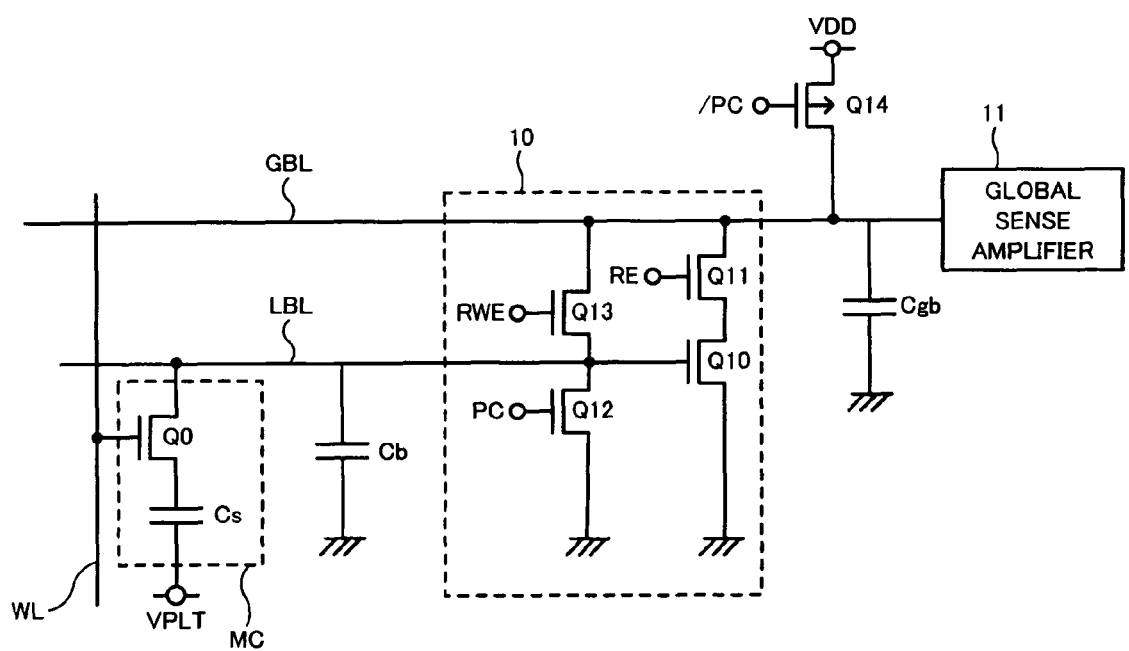
FIG. 1 is a block diagram showing a main part of a DRAM of an embodiment.

FIG. 1 shows a main part of the DRAM of the embodiment. In FIG. 1, an example of a circuit configuration of the embodiment is shown, which corresponds to an area including one word line WL, one local bit line LBL, one memory cell MC arranged at an intersection thereof, one single-ended local sense amplifier 10 (the sense amplifier circuit of the invention) composed of four NMOS transistors Q10, Q11, Q12 and Q13, one global sense amplifier 11 and a PMOS transistor Q14 on an input side of the global sense amplifier 11.

A hierarchical memory cell array is assumed in the DRAM of the embodiment, in which a hierarchical bit line structure and a hierarchical sense amplifier circuit structure are employed. That is, a predetermine number of local bit lines LBL are corresponded to one global bit line GBL, and a predetermine number of local sense amplifiers 10 are corresponded to one global sense amplifier 11. Thereby, an increase in the number of memory cells connected to one local bit line LBL can be suppressed. Each local bit line LBL to which a selected memory cell MC belongs is connected to the global bit line GBL via the local sense amplifier 10, and data can be read or written by the global sense amplifier 11.

The memory cell MC is composed of a selection NMOS transistor Q0 and a capacitor Cs storing information corresponding to accumulated charge. The selection NMOS transistor Q0 has a gate connected to the word line WL, a source connected to the local bit line LBL, and a drain connected to one terminal of the capacitor Cs. The other terminal of the capacitor Cs is connected to a line of a cell plate voltage VPLT. Although FIG. 1 shows only one memory cell MC, a plurality of memory cells MC are actually connected to each local bit line LBL. Thereby, a parasitic capacitance Cb is formed at each local bit line LBL, as shown in FIG. 1. The parasitic capacitance Cb has a capacitance of about 10 fF, for example. In addition, the capacitor Cs of the memory cell MC has a capacitance of about 20 fF, for example.

Figure 2:
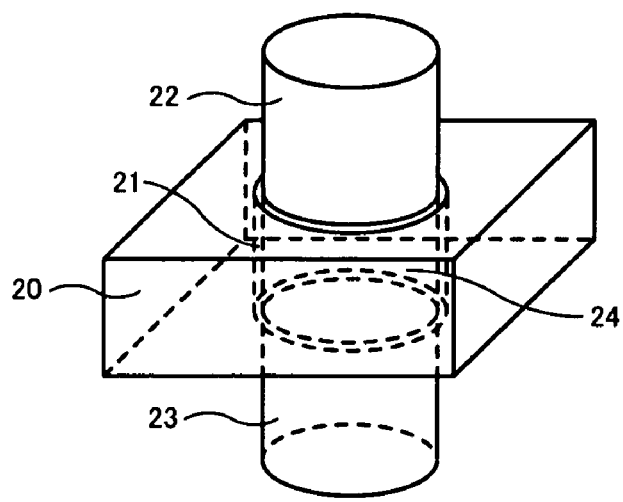
FIG. 2 is a structure diagram of a MOS transistor having a surround gate structure.

This embodiment employs a floating body type NMOS transistor as the selection NMOS transistor Q0. FIG. 2 is a structure diagram of a MOS transistor having a surround gate structure particularly suitable for reducing an occupied area, which is an example of the floating body type NMOS transistor used in this embodiment. In the NMOS transistor shown in FIG. 2, a gate electrode 20 surrounding a central portion of a longitudinally extending pillar-shaped semiconductor region is formed and an insulating film 21 is formed between the gate electrode 20 and the semiconductor region. Further, a drain region (source/drain region) 22 and a source region (source/drain region) 23 are formed by doping impurity into upper and lower portions of the pillar-shaped semiconductor region, and a body 24 as a floating body is formed in the semiconductor region between the drain region 22 and the source region 23.

Figure 3:
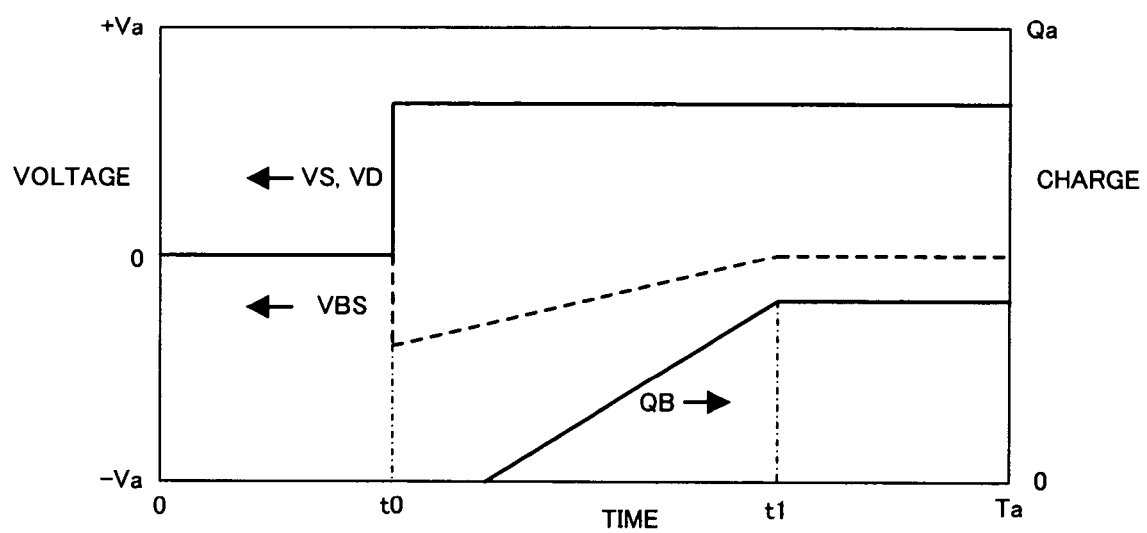
FIG. 3 is a diagram for explaining a situation in which holes are accumulated in a floating body of a floating body type NMOS transistor.

Since the NMOS transistor having the surround gate structure shown in FIG. 2 is the floating body type MOS transistor, a phenomenon in which holes are accumulated due to impact ionization becomes a problem. Here, a situation in which holes are accumulated in the floating body of the floating body type NMOS transistor will be described using FIG. 3. FIG. 3 is a diagram showing simulation result of the floating body type NMOS transistor, in which a horizontal axis represents a time ranging from 0 to Ta, a longitudinal axis at the left side represents a drain voltage VD, a source voltage VS and a source-body voltage VBS respectively within a range from −Va to +Va, and a longitudinal axis at the right side represents a charge QB of holes accumulated in the floating body within a range from 0 to Qa.

As shown in FIG. 3, the drain voltage VD, the source voltage VS and the source-body voltage VBS are all maintained at 0V at an early point. Then, when the drain voltage VD and the source voltage VS increase to a predetermined voltage after a time t0 elapses, the source-body voltage VBS decreases. Thereafter, holes are accumulated in the floating body over time so that the charge QB increases, and correspondingly the source-body voltage VBS gradually approaches 0V. That is, the potential of the floating body changes so as to gradually approach the source voltage VS. In this manner, the accumulation of holes in the floating body causes characteristic deteriorations in the MOS transistor, such as parasitic bipolar effect, a decrease in the threshold voltage and occurrence of a kink in voltage current characteristics. This embodiment prevents the characteristic deteriorations due to the accumulation of holes in the body 24 by supplying an appropriate potential to the selection NMOS transistor Q0, which will be described in detail below.

Returning to FIG. 1, in the local sense amplifier 10, two NMOS transistors Q11 and Q10 are connected in series between the global bit line GBL and ground. The NMOS transistor Q10 has a gate connected to the local bit line LBL, and amplifies a signal voltage of the local bit line LBL and converts it into a drain current. The NMOS transistor Q11 switches connection between the drain of the NMOS transistor Q10, which is a read-out node in a reading operation, and the global bit line GBL in response to a control signal RE inputted to the gate of the NMOS transistor Q11. In this embodiment, the floating body type NMOS transistor is also employed as the NMOS transistor Q10 of the local sense amplifier 10 similarly as the selection NMOS transistor Q0, and this embodiment prevents the above-mentioned characteristics deteriorations by supplying an appropriate potential to the NMOS transistor Q10, which will be described in detail below.

In FIG. 1, two NMOS transistors Q13 and Q12 are connected in series between the global bit line GBL and the ground, and an intermediate node therebetween is connected to the local bit line LBL. The NMOS transistor Q12 functioning as a precharge circuit precharges the local bit line LBL in response to a precharge signal PC inputted to the gate. When the precharge signal PC is controlled to be high, the local bit line LBL is precharged to a ground potential. The NMOS transistor Q13 switches connection between the local bit line LBL and the global bit line GBL in response to a control signal RWE inputted to the gate.

In a read operation in the configuration of FIG. 1, the signal voltage is read out to the local bit line LBL by a charge sharing of a transmission path including a capacitance of the capacitor Cs of the memory cell MC and the parasitic capacitance Cb at the local bit line LBL. Thus, in the read operation, the selection NMOS transistor Q0 of the memory cell MC is turned on so that the charge sharing is started, and a sufficient difference corresponding to existence of the accumulated charge on the capacitor Cs can be obtained at the potential of the local bit line LBL after several ns. Therefore, by setting a sense term for the local sense amplifier 10 within a range until the elapse of this several ns, sufficient margin to complete a sense amplifying operation by the NMOS transistor Q10 can be obtained. Due to such an operating principle, the number of memory cells MC connected to the local bit line LBL is desired to be set within a range where the signal voltage required for the charge sharing can be obtained.

The PMOS transistor Q14 on the input side of the global sense amplifier 11 is connected between a power supply voltage VDD and the global bit line GBL. The PMOS transistor Q14 precharges the global bit line GBL in response to an inverted precharge signal /PC inputted to the gate. When the inverted precharge signal /PC is controlled to be low, the global bit line GBL is precharged to the power supply voltage VDD. In addition, a parasitic capacitance Cgb is formed at each global bit line GBL, as shown in FIG. 1. The parasitic capacitance Cgb has a capacitance of about 40 fF, for example.

The global sense amplifier 11 latches the signal transmitted through the global bit line GBL connected to the input side and determines a binary value of high or low. The global sense amplifier 11 is selectively connected to an external circuit (not shown), outputs read data inputted through the global bit line GBL to outside, and receives write data from outside so as to output it to the global bit line GBL.

Although FIG. 1 shows only one local sense amplifier 10, a plurality of local sense amplifiers 10 are actually connected to one global bit line GBL. Then, in the read operation, a local sense amplifier 10 corresponding to a selected memory cell MC is selectively connected to the global bit line GBL.

Figure 4:
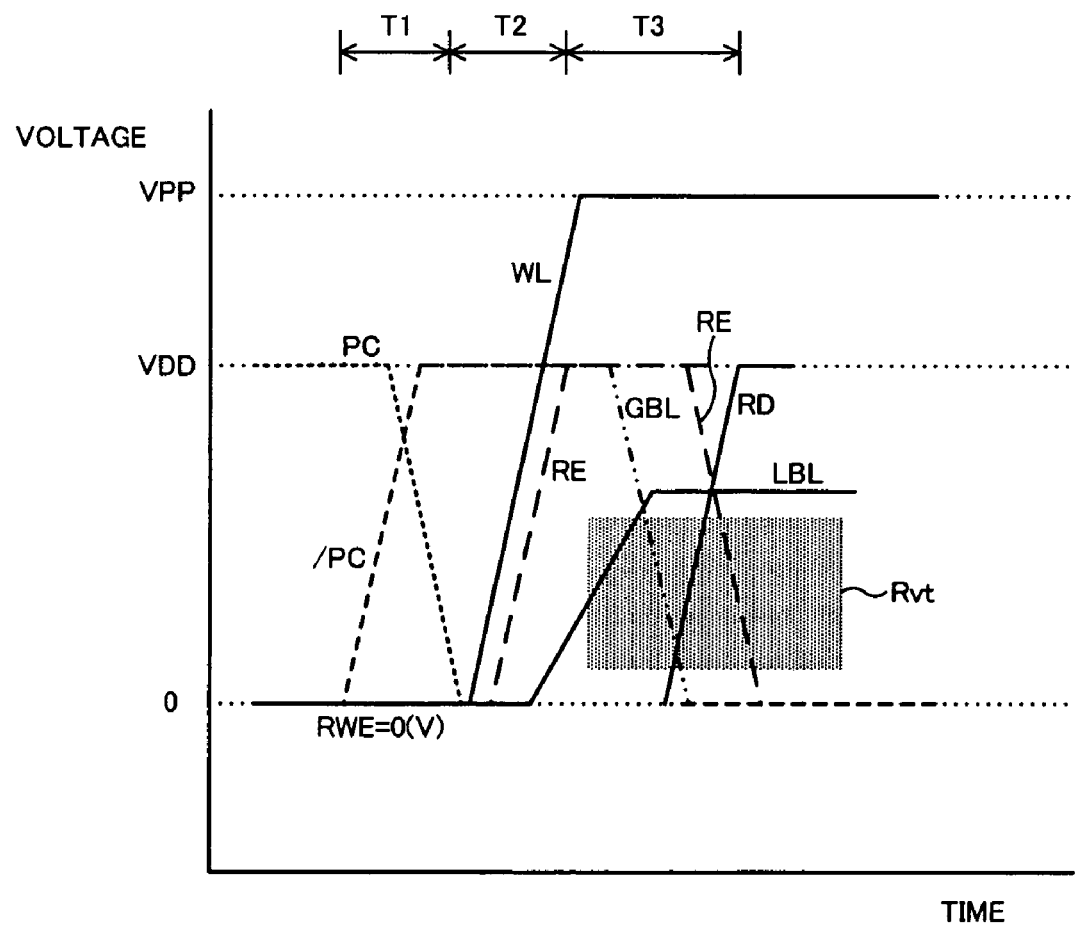
FIG. 4 is a diagram for explaining a read operation of the DRAM of the embodiment in case of reading high level data from a memory cell.
Figure 5:
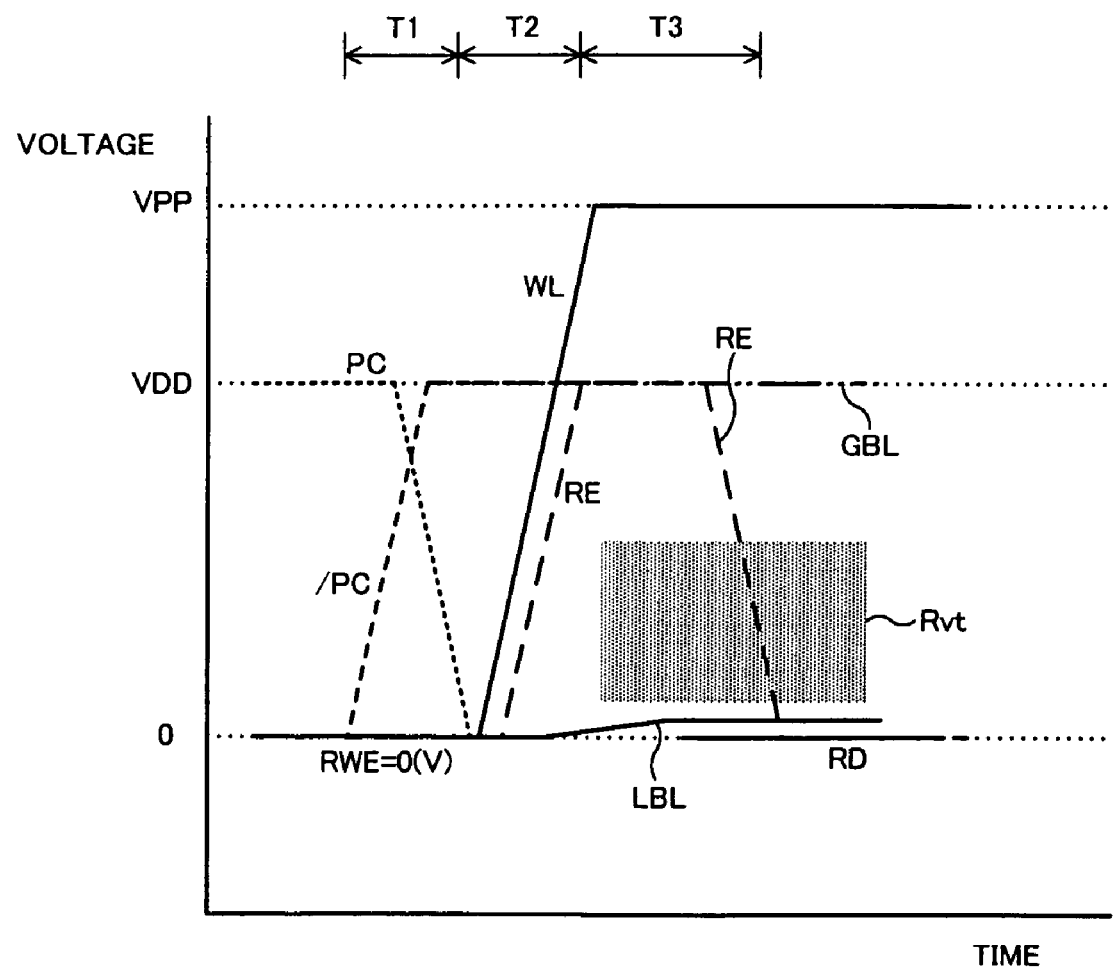
FIG. 5 is a diagram for explaining the read operation of the DRAM of the embodiment in case of reading low level data from the memory cell.

Next, the read operation of the DRAM of the embodiment will be described using FIGS. 4 and 5. FIG. 4 shows signal waveforms in case of reading high level data from the memory cell MC, and FIG. 5 shows signal waveforms in case of reading low level data from the memory cell MC. In FIGS. 4 and 5, the horizontal axis represents time and the longitudinal axis represents voltage. Further, in upper parts of FIGS. 4 and 5, the entire read operation is divided into three terms including a precharge cancellation term T1, a cell selection term T2 and a sense term T3.

When reading high level data from the memory cell MC, the precharge signal PC is maintained high and the inverted precharge signal /PC is maintained low, before the precharge cancellation term T1, as shown in FIG. 4, and the local bit line LBL and the global bit line GBL are in a state of being precharged. Then, in the precharge cancellation term T1, the precharge signal PC changes to low and the inverted precharge signal /PC changes to high. Thereby, the local bit line LBL which is precharged to the ground potential is brought into a state of floating, and the global bit line GBL which is precharged to the power supply voltage VDD is latched in a latch circuit (not shown) in the global sense amplifier 11.

Subsequently, in the cell selection term T2, the potential of a selected word line WL increases from the ground to a positive voltage VPP, and the control signal RE changes from low to high. Thereby, the signal voltage of high level is read out from the memory cell MC to the local bit line LBL, which thereafter shifts to the sense term T3. In addition, the positive voltage VPP of the word line WL is set higher than the high level (the power supply voltage VDD).

In the sense term T3, the potential of the local bit line LBL is increased to a predetermined level. As shown in FIG. 4, the potential of the local bit line LBL is set to a value higher than an upper limit of a distribution range Rvt (indicated by hatching in the figure) of a threshold voltage of the NMOS transistor Q10. Since a large drain current flows when a sufficiently high gate voltage is supplied from the local bit line LBL to the NMOS transistor Q10, electric charge charged on the parasitic capacitance Cgb at the global bit line GBL can be extracted through the NMOS transistors Q11 and Q10 in a short time. Thereby, the potential of the global bit line GBL is discharged from the power supply voltage VDD to the ground potential, the signal latched in the global sense amplifier 11 is inverted, and data of high level is outputted (signal RD). Thereafter, when the control signal RE changes from high to low, the NMOS transistor Q11 is turned off so that the local bit line LBL is disconnected from the global sense amplifier 11, and the sense term T3 is finished.

In case of reading low level data from the memory cell MC, the basic control is almost common to the case of FIG. 4, as shown in FIG. 5, and therefore different points will be described. Among signal waveforms of FIG. 5, respective waveforms of the local bit line LBL and the global bit line GBL are different from those in FIG. 4. That is, in the sense term T3, the potential of the local bit line LBL has a slightly lower value than a lower limit of the distribution range Rvt of the threshold voltage of the NMOS transistor Q10. Therefore, the drain current of the NMOS transistor Q10 does not flow and the electric charge charged on the parasitic capacitance Cgb at the global bit line GBL is not extracted, so that the potential of the global bit line GBL is maintained high. Thereby, the global sense amplifier 11 outputs low level data obtained by inverting the high level data.

As understood from FIGS. 4 and 5, before the precharge cancellation term T1, the local bit line LBL is in a state of being precharged to the ground potential (0V). Accordingly, the potential of the source region 23 of the selection NMOS transistor Q0 of the floating body type is fixed to the ground potential. Since holes are not accumulated in the body 24 (FIG. 2), the potential of the body 24 converges to the ground potential. Further, since the source region 23 of the floating body type NMOS transistor Q10 of the local sense amplifier 10 is always fixed to the ground potential (0V), holes are not accumulated in the body 24 of the NMOS transistor Q10, and thus the potential of the body 24 converges to the ground potential. In this manner, in the selection NMOS transistor Q0 and the NMOS transistor Q10, characteristic deteriorations such as the parasitic bipolar effect, the decrease in the threshold voltage and the occurrence of a kink in voltage current characteristics, respectively due to the accumulation of holes in the body 24 can be suppressed, and it is possible to maintain desired characteristics in relation to the read operation and the amplifying operation. In addition, the potential supplied to the floating body type NMOS transistor is not limited to the ground potential, and a predetermined voltage fixed lower than the ground potential can be available.

Although in this embodiment, the case has been described in which the floating body type transistor is employed as the selection NMOS transistor Q0 of the memory cell MC and as the NMOS transistor Q10 of the local sense amplifier 10, the floating body type transistor may also be employed as other NMOS transistors Q11, Q12 and Q13 shown in FIG. 1. Thereby, the occupied area of the NMOS transistors Q11 to Q13 can be reduced. In addition, each of these NMOS transistors Q11 to Q13 functions as a simple switch, and therefore influence on characteristics of the above-mentioned floating body type transistor can be neglected.

Figure 6:
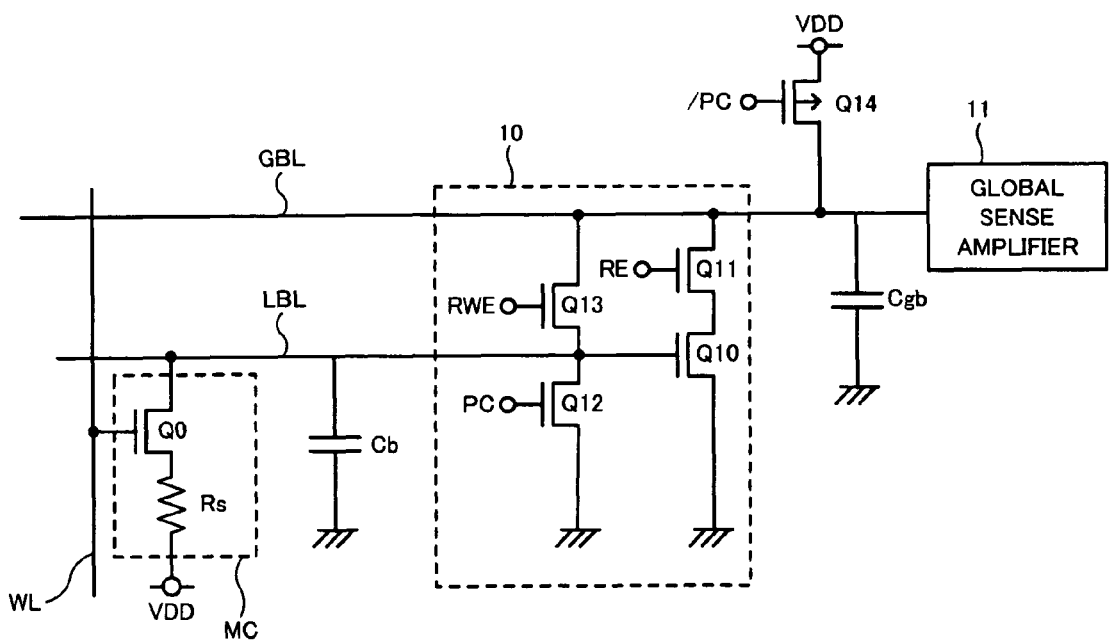
FIG. 6 is a diagram showing a main part of a ReRAM of a first modification of the embodiment.

Next, a plurality of modifications applicable to the embodiment will be described. FIG. 1 shows the memory cell MC composed of the selection NMOS transistor Q0 and the capacitor Cs, however, cases in which the capacitor Cs of the memory cell MC is replaced with other elements will be described in the following modifications. FIG. 6 shows a main part of a ReRAM (Resistance change RAM) of a first modification of the embodiment. In the first modification, the memory cell MC is composed of the selection NMOS transistor Q0 of the floating body type and a resistance element Rs storing information corresponding to a resistance value. The selection NMOS transistor Q0 has a gate connected to the word line WL, a source connected to the local bit line LBL, and a drain connected to one terminal of the resistance element Rs. The other terminal of the resistance element Rs is connected to a line of the power supply voltage VDD. Other components in FIG. 6 are common to those in FIG. 1, so description thereof will be omitted.

As to the resistance element Rs of the memory cell MC, for example, a lower limit of a resistance value distribution of high resistance state is 100 MΩ, and a higher limit of a resistance value distribution of low resistance state is 100 kΩ. As a result, a time constant of a circuit portion including the parasitic capacitance Cb at the local bit line LBL and the resistance element Rs is over 1 us in a case where the resistance element Rs is in the high resistance state, and is under 1 ns in a case where the resistance element Rs is in the low resistance state. Accordingly, in the read operation, after charge/discharge of the local bit line LBL is started by turning on the selection NMOS transistor Q0, a sufficient difference of the potential of the local bit line LBL can be obtained depending on the resistance value of the resistance element Rs after about several ns. Therefore, by setting the sense term T3 within a range until the elapse of this several ns, sufficient margin to complete the sense amplifying operation by the NMOS transistor Q10 can be obtained. In addition, the number of memory cells MC connected to the local bit line LBL can be set to various values based on the above operating principal so that a value of the parasitic capacitance Cb calculated in accordance with the resistance value of the resistance element Rs and the time length of the sense term T3 can be obtained.

Figure 7:
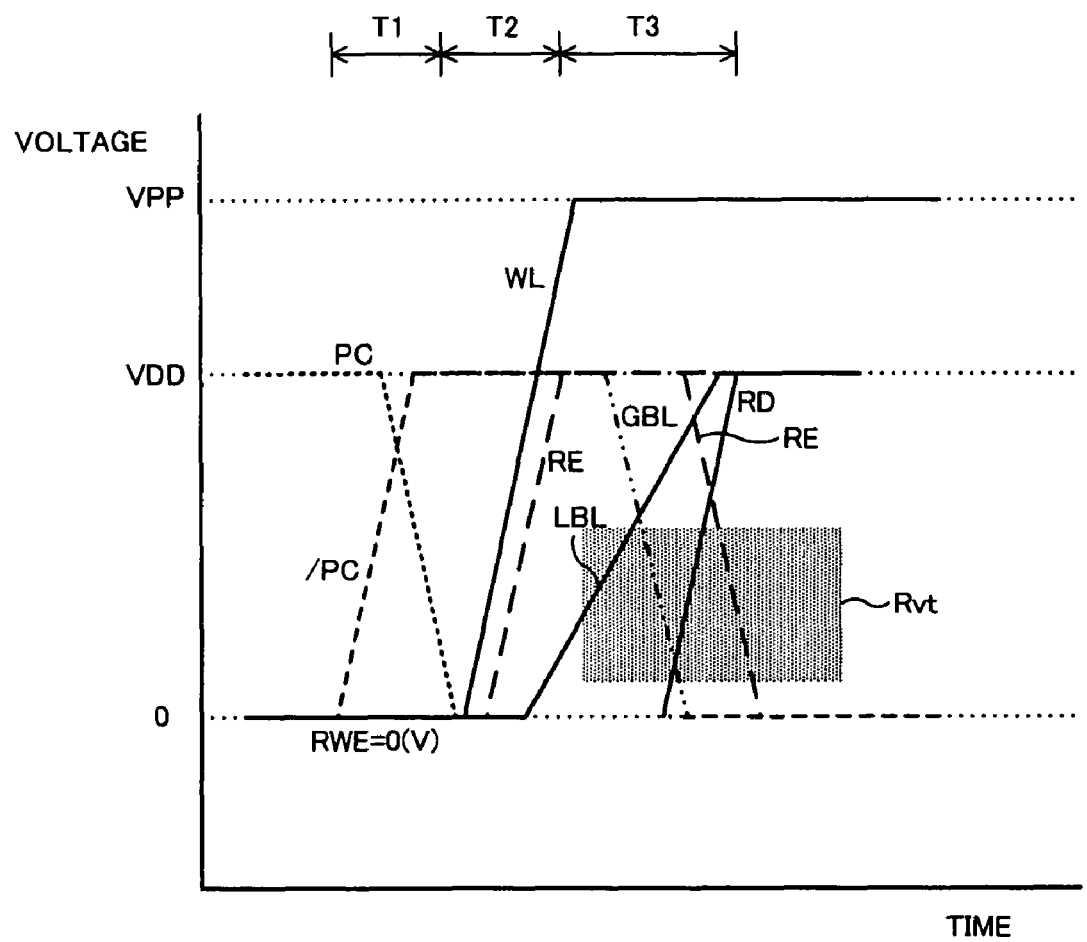
FIG. 7 is a diagram for explaining a read operation of the ReRAM of the first modification in case of reading high level data from a memory cell.
Figure 8:
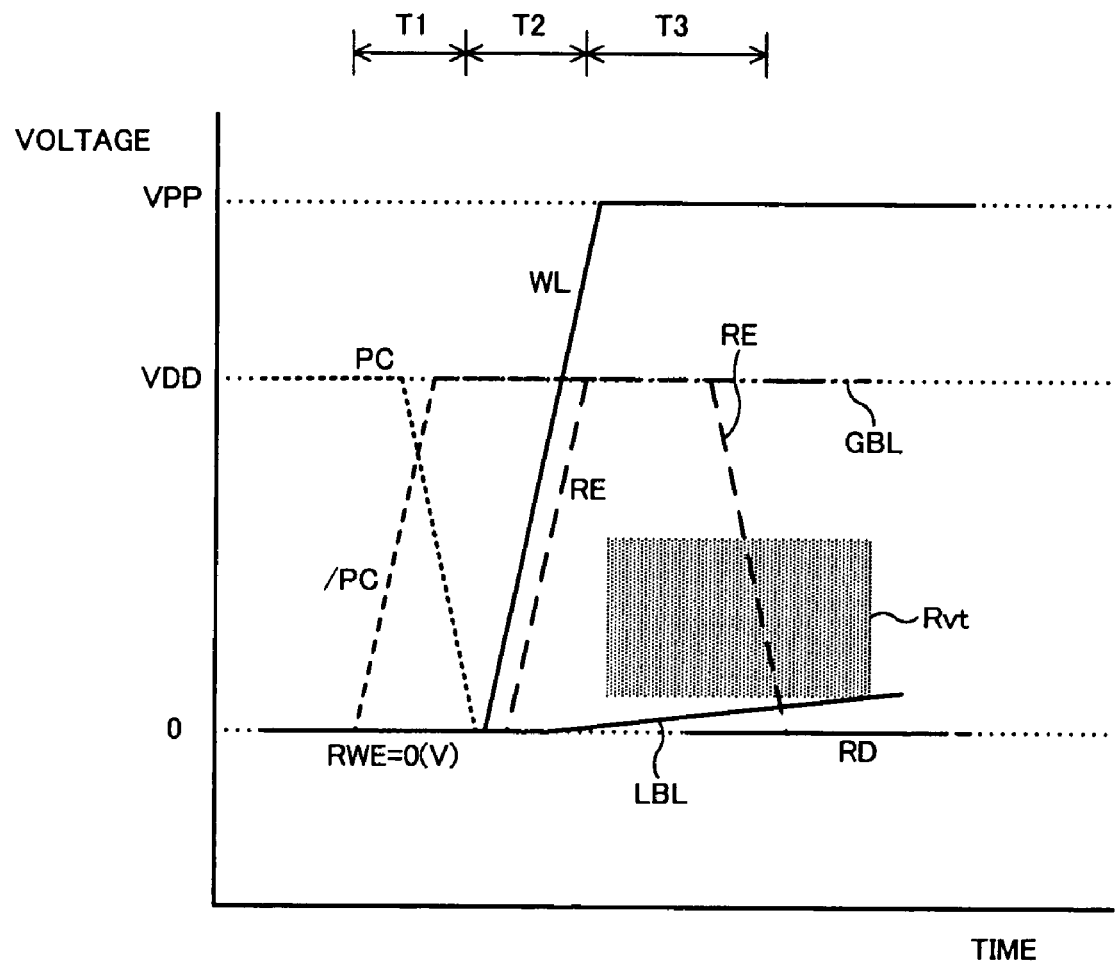
FIG. 8 is a diagram for explaining the read operation of the ReRAM of the first modification in case of reading low level data from the memory cell.

Next, the read operation of the DRAM of the first modification will be described using FIGS. 7 and 8. FIG. 7 shows signal waveforms in case of reading high level data (low resistance state) from the memory cell MC, and FIG. 8 shows signal waveforms in case of reading low level data (high resistance state) from the memory cell MC. FIGS. 7 and 8 correspond to FIGS. 4 and 5, and many of the signal waveforms are common, and therefore different points will be described below.

When high level data for which the resistance element Rs is in the low resistance state is read out from the memory cell MC in the sense term T3 of FIG. 7, the potential of the local bit line LBL increases over the upper limit of the distribution range Rvt of the threshold voltage of the NMOS transistor Q10, as different form FIG. 4. Therefore, the potential of the global bit line GBL is rapidly discharged from the power supply voltage VDD to the ground potential by an increase in the drain current of the NMOS transistor Q10 in the same manner as in FIG. 4.

Meanwhile, when low level data for which the resistance element Rs is in the high resistance state is read out from the memory cell MC, the potential of the local bit line LBL gradually increases in the sense term T3 of FIG. 8, however, is not over the lower limit of the distribution range Rvt of the threshold voltage of the NMOS transistor Q10. Therefore, the drain current of the NMOS transistor Q10 does not flow, and the potential of the global bit line GBL is maintained high in the same manner as in FIG. 5.

As understood from FIGS. 7 and 8, the local bit line LBL is in a state of being precharged to the ground potential (0V) before the precharge cancellation term T1, and therefore the effect that holes are not accumulated in the body 24 of the selection NMOS transistor Q0 of the floating body type can be obtained in the same manner as in FIGS. 4 and 5. Further, the above-mentioned effect can be obtained by the floating body type NMOS transistor Q10 of the local sense amplifier 10. Accordingly, when employing the first modification, it is possible to suppress the characteristic deteriorations such as the parasitic bipolar effect, the decrease in the threshold voltage and the occurrence of a kink in voltage current characteristics, respectively due to the accumulation of holes in the body 24 (FIG. 2).

Figure 9:
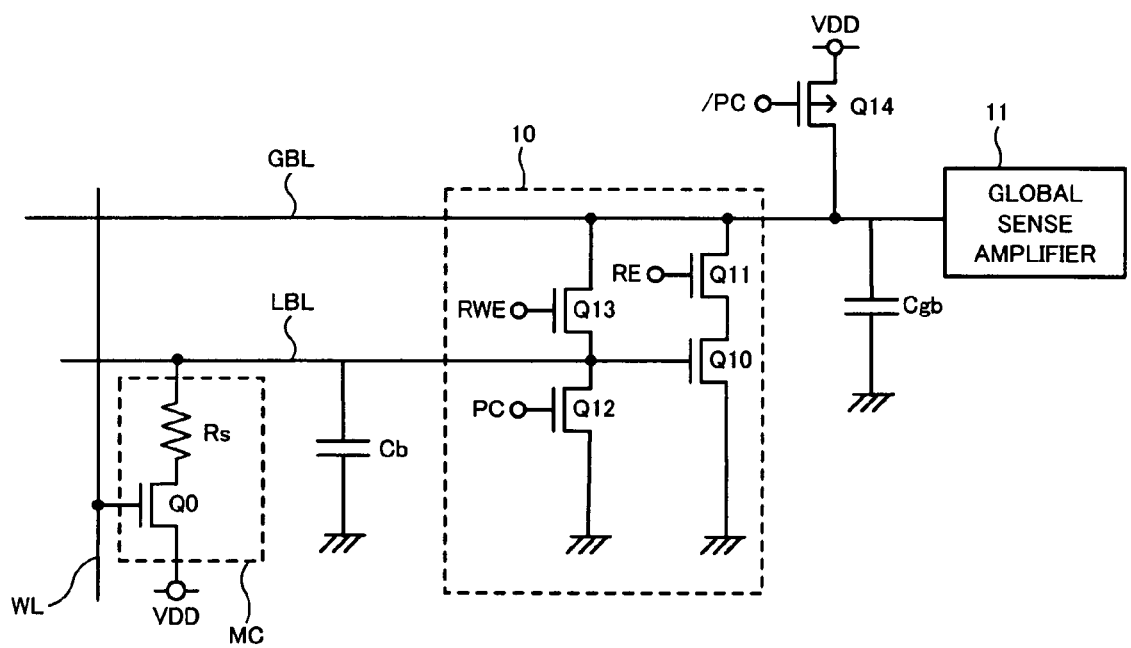
FIG. 9 is a diagram showing a main part of a ReRAM of a second modification of the embodiment.

Next, FIG. 9 shows a main part of a ReRAM of a second modification of the embodiment. In the second modification, a connection relation between the selection NMOS transistor Q0 of the floating body type and the resistance element Rs in the memory cell MC is reversed with the first modification. That is, the selection NMOS transistor Q0 has a gate connected to the word line WL, a source connected to one terminal of the resistance element Rs, and a drain connected to a line of the power supply voltage VDD. The other terminal of the resistance element Rs is connected to the local bit line LBL. Other components in FIG. 9 are common to those in FIGS. 1 and 6, so description thereof will be omitted. When employing the second modification, the same effect as the first modification can be obtained.

Figure 10:
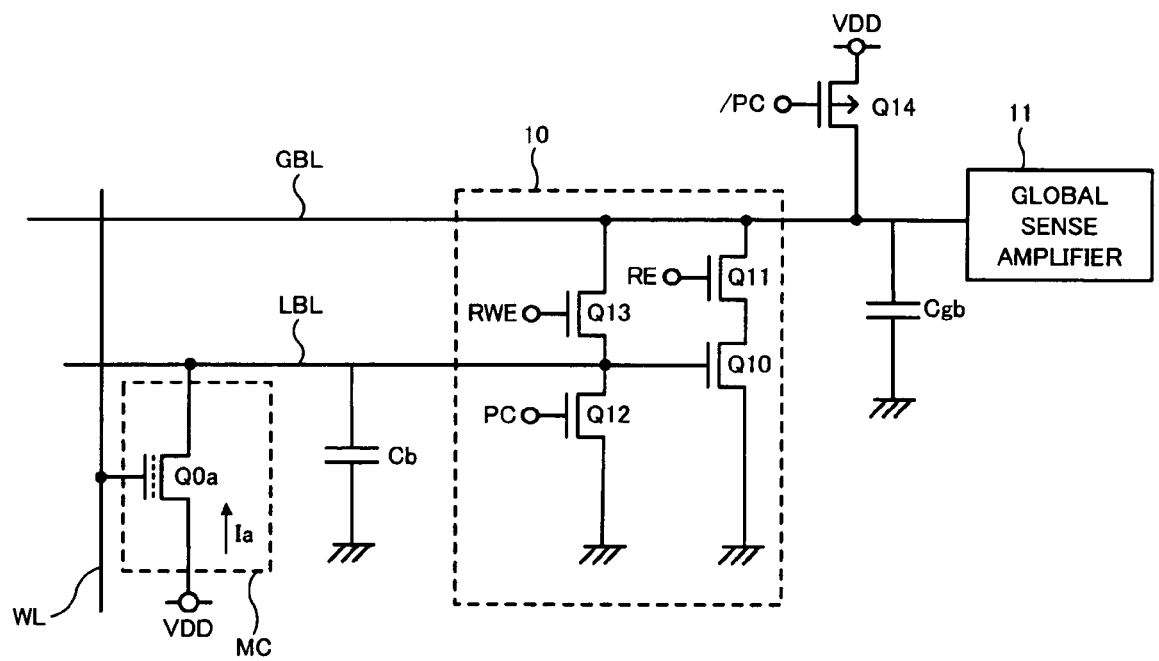
FIG. 10 is a diagram showing a main part of a charge trap type RAM of a third modification of the embodiment.

Next, FIG. 10 shows a main part of a charge trap type RAM of a third modification of the embodiment. In the third modification, the memory cell MC is composed of a selection NMOS transistor Q0a of the floating body type in which a charge trap region is provided on a gate insulating film. A capacitor and a resistance element are not required to be provided in the memory cell MC, and the memory cell MC can store binary information corresponding to a state that electrons are accumulated and a state that electrons are not accumulated respectively in the charge trap region of the selection NMOS transistor Q0a. The selection NMOS transistor Q0a has a gate connected to the word line WL, a source connected to the local bit line LBL, and a drain connected to the power supply voltage VDD.

The signal waveform diagrams of FIGS. 7 and 8 are almost common to the third modification. In the third modification, when the word line WL is driven to read out the memory cell MC, the threshold voltage of the selection NMOS transistor Q0*a* decreases so that the on-resistance thereof is reduced, in the state that electrons are not accumulated in the charge trap region of the selection NMOS transistor Q0*a*. A lower limit value of an on-current Ia (FIG. 10) in this state is, for example, 10 uA. Further, the threshold voltage of the selection NMOS transistor Q0*a* increases so that the on-resistance thereof is increased, in the state that electrons are accumulated in the charge trap region of the selection NMOS transistor Q0*a*. An upper limit value of the on-current Ia in this state is, for example, 10 nA. In this manner, the current flowing through the resistance element Rs of the memory cell MC in FIGS. 7 and 8 is nearly equal to the on-current Ia of the NMOS transistor Q0*a* of the third modification. Thus, when employing the memory cell MC of the third modification, the operation can be performed based on the almost same control method as in the first modification.

Figure 11:
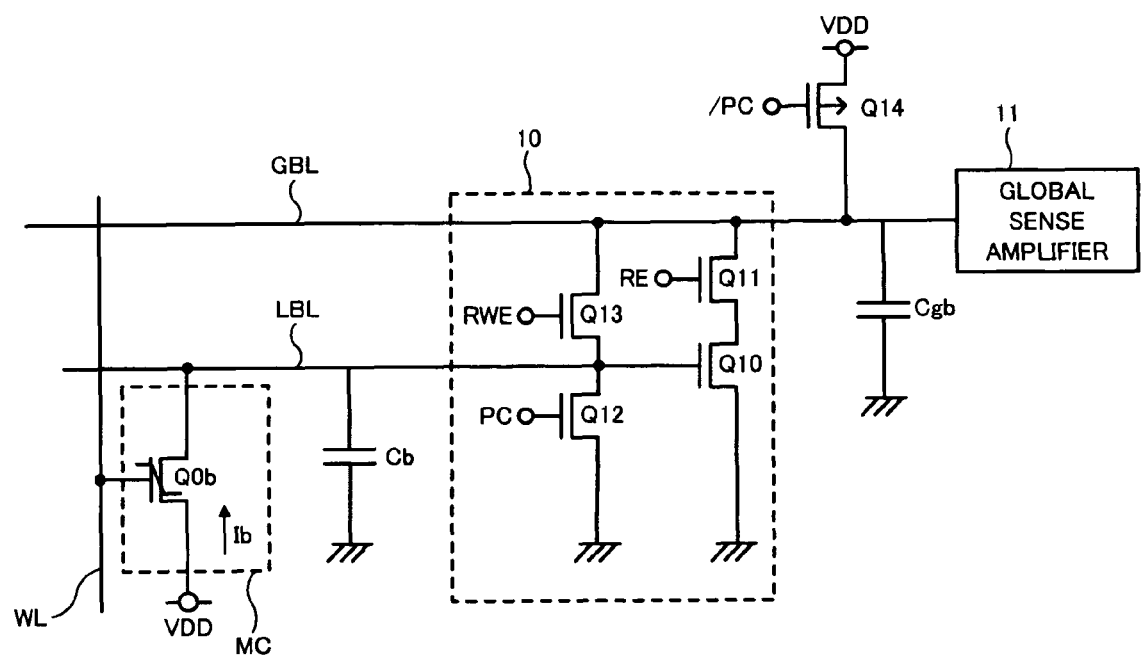
FIG. 11 is a diagram showing a main part of a FeRAM of a fourth modification of the embodiment.

Next, FIG. 11 shows a main part of a FeRAM (ferroelectric RAM) of a fourth modification of the embodiment. In the fourth modification, the memory cell MC is composed of a selection NMOS transistor Q0*b* of the floating body type in which a gate insulating film is formed using ferroelectric material. A capacitor and a resistance element are not required to be provided in the memory cell MC, and the memory cell MC can store binary information corresponding to a polarization direction of a ferroelectric film in the selection NMOS transistor Q0. The selection NMOS transistor Q0*b* has a gate connected to the word line WL, a source connected to the local bit line LBL, and a drain connected to the power supply voltage VDD.

The signal waveform diagrams of FIGS. 7 and 8 are almost common to the fourth modification. In the fourth modification, when the word line WL is driven to read out the memory cell MC, the threshold voltage of the selection NMOS transistor Q0*b* decreases so that the on-resistance thereof is reduced, in the state that the positive polarization direction of the ferroelectric film is at the channel-side. A lower limit value of an on-current Ib (FIG. 11) in this state is, for example, 10 uA. Further, the threshold voltage of the selection NMOS transistor Q0*b* increases so that the on-resistance thereof is increased, in the state that the negative polarization direction of the ferroelectric film is at the channel-side. An upper limit value of the on-current Ib in this state is, for example, 10 nA. In this manner, the current flowing through the resistance element Rs of the memory cell MC in FIGS. 7 and 8 is nearly equal to the on-current Ib of the NMOS transistor Q0*b* of the fourth modification. Thus, when employing the memory cell MC of the fourth modification, the operation can be performed based on the almost same control method as in the first modification.

In the foregoing, contents of the embodiment have been specifically described based on the embodiment. However, the present invention is not limited to the above described embodiment, and can variously be modified without departing the essentials of the present invention. For example, the above embodiment has described the case where the NMOS transistor having the surround gate structure shown in FIG. 2 is used as the floating body type NMOS transistor. However, floating body type NMOS transistors having other structures may be employed. For example, a planar MOS transistor may be formed on the SOI substrate. In this structure, source/drain regions are formed extending to a lower insulating film, and a body between the source region and the drain region is formed under the gate. Further, for example, a MOS transistor having a Fin structure may be used. In this structure, a gate electrode and source/drain regions are formed in a thin wall shaped Fin-type semiconductor, and a body is formed in a semiconductor region surrounded by the source/drain regions and the gate electrode.

What is claimed is:

1. A semiconductor memory device comprising:
   a memory cell including a first MOS transistor having first source and drain regions, a first gate electrode connected to a word line, and a first body region being free from fixation in electrical potential, and one of the first source and drain regions being connected to a bit line; and
   a sense amplifier circuit including a second MOS transistor having second source and drain regions, a second gate electrode connected to the bit line, and a second body region being free from fixation in electrical potential.

2. The semiconductor memory device according to claim 1, wherein the first body region is surrounded by the first gate electrode, and the second body region is surrounded by the second gate electrode.

3. The semiconductor memory device according to claim 1, wherein the first and second MOS transistors are the same in conduction type as each other.

4. The semiconductor memory device according to claim 1, wherein the sense amplifier circuit further includes a third MOS transistor having third source and drain regions, a third gate electrode, and a third body region being free from fixation in electrical potential, one of the third source and drain regions connected to the bit line to charge the bit line in electrical potential.

5. The semiconductor memory device according to claim 4, wherein the third MOS transistor is the same in conduction type as the first MOS transistor.

6. The semiconductor memory device according to claim 1, wherein the memory cell further includes a memory cell capacitor connected to the other of the first source and drain regions of the first MOS transistor, the bit line allowing the second MOS transistor of the sense amplifier to be in an ON state when the memory cell capacitor stores a first data, and inhibiting the second MOS transistor of the sense amplifier from being in the ON state when the memory cell capacitor stores a second data.

7. The semiconductor memory device according to claim 1, wherein the bit line and the sense amplifier circuit are respectively defined as a local bit line and a local sense amplifier circuit, the semiconductor memory device further comprising a global bit line and a global sense amplifier circuit, the local sense amplifier circuit amplifying an electrical level of the local bit line to generate an amplified electrical level on the global bit line, and the global sense amplifier circuit amplifying the amplified electrical level of the global bit line.

8. The semiconductor memory device according to claim 7, wherein the memory cell further includes a memory cell capacitor connected to the other of the first source and drain regions of the first MOS transistor and the electrical level of the local bit line is determined by a charge amount of the memory cell capacitor.

9. The semiconductor memory device according to claim 2, wherein the first and second gate electrodes are electrically independent of each other.

10. A semiconductor device comprising:
    a memory cell including a first transistor having first source and drain regions, a first gate electrode connected to a word line, and a first body region being free from fixation in electrical potential, and one of the first source and drain regions being connected to a bit line; and a sense amplifier circuit including a second transistor having second source and drain regions, a second gate electrode connected to the bit line, and a second body region being free from fixation in electrical potential.

11. The semiconductor device according to claim 10, wherein the first body region is surrounded by the first gate electrode, and the second body region is surrounded by the second gate electrode.

12. The semiconductor device according to claim 10, wherein the first and second transistors are the same in conduction type as each other.

13. The semiconductor device according to claim 10, wherein the sense amplifier circuit further includes a third transistor having third source and drain regions, a third gate electrode, and a third body region being free from fixation in electrical potential, one of the third source and drain regions connected to the bit line to charge the bit line in electrical potential.

14. The semiconductor device according to claim 13, wherein the third transistor is the same in conduction type as the first transistor.

15. The semiconductor device according to claim 10, wherein the memory cell further includes a memory cell capacitor connected to the other of the first source and drain regions of the first transistor, the bit line allowing the second transistor of the sense amplifier to be in an ON state when the memory cell capacitor stores a first data, and inhibiting the second transistor of the sense amplifier from being in the ON state when the memory cell capacitor stores a second data.

16. The semiconductor device according to claim 10, wherein the bit line and the sense amplifier circuit are respectively defined as a local bit line and a local sense amplifier circuit, the semiconductor device further comprising a global bit line and a global sense amplifier circuit, the local sense amplifier circuit amplifying an electrical level of the local bit line to generate an amplified electrical level on the global bit line, and the global sense amplifier circuit amplifying the amplified electrical level of the global bit line.

17. The semiconductor device according to claim 16, wherein the memory cell further includes a memory cell capacitor connected to the other of the first source and drain regions of the first transistor and the electrical level of the local bit line is determined by a charge amount of the memory cell capacitor.

18. The semiconductor device according to claim 11, wherein the first and second gate electrode are electrically independent of each other.

19. The semiconductor device according to claim 1, wherein each of the first and second body regions is brought into an electrically floating state.

20. The semiconductor device according to claim 10, wherein each of the first and second body regions is brought into an electrically floating state.

* * * * *